US008189333B2

(12) United States Patent
Foster

(10) Patent No.: US 8,189,333 B2
(45) Date of Patent: May 29, 2012

(54) CONNECTOR ASSEMBLIES INCORPORATING CERAMIC INSERTS HAVING CONDUCTIVE PATHWAYS AND INTERFACES

(75) Inventor: Nathan Foster, Wenatchee, WA (US)

(73) Assignee: Pacific Aerospace & Electronics, Inc., Wenatchee, WA (US)

( * ) Notice: Subject to any disclaimer, the term of this patent is extended or adjusted under 35 U.S.C. 154(b) by 137 days.

(21) Appl. No.: 12/559,210

(22) Filed: Sep. 14, 2009

(65) Prior Publication Data

US 2010/0068936 A1 Mar. 18, 2010

Related U.S. Application Data

(60) Provisional application No. 61/097,105, filed on Sep. 15, 2008.

(51) Int. Cl.
*H05K 7/20* (2006.01)

(52) U.S. Cl. ......................... 361/690; 439/559; 361/739

(58) Field of Classification Search .......... 439/566–568, 439/559; 361/690, 739
See application file for complete search history.

(56) References Cited

U.S. PATENT DOCUMENTS

| | | | | |
|---|---|---|---|---|
| 4,228,841 | A * | 10/1980 | Dixon | 160/183 |
| 4,426,774 | A * | 1/1984 | Stuckey | 29/841 |
| 4,530,552 | A * | 7/1985 | Meehan et al. | 439/68 |
| 4,652,973 | A * | 3/1987 | Baker et al. | 361/739 |
| 5,110,307 | A | 5/1992 | Rapoza | |
| 5,353,191 | A * | 10/1994 | Volz et al. | 361/690 |
| 5,782,891 | A | 7/1998 | Hassler et al. | |
| 6,121,539 | A | 9/2000 | Johnson et al. | |
| 6,262,357 | B1 | 7/2001 | Johnson et al. | |
| 6,278,049 | B1 | 8/2001 | Johnson et al. | |
| 6,328,483 | B1 | 12/2001 | Havasi et al. | |
| 6,932,644 | B1 | 8/2005 | Taylor | |
| 7,144,274 | B2 | 12/2006 | Taylor | |
| 7,166,537 | B2 | 1/2007 | Jacobsen et al. | |
| 7,182,640 | B2 | 2/2007 | Garrett et al. | |
| 7,267,559 | B2 * | 9/2007 | Hashitani et al. | 439/91 |
| 7,300,310 | B2 | 11/2007 | Taylor | |
| 7,332,805 | B2 | 2/2008 | Natarajan et al. | |
| 7,878,820 | B2 * | 2/2011 | Tada et al. | 439/67 |
| 2005/0251777 | A1 | 11/2005 | Bartley et al. | |
| 2008/0036075 | A1 | 2/2008 | Taylor | |

* cited by examiner

*Primary Examiner* — Truc Nguyen
(74) *Attorney, Agent, or Firm* — Ann W. Speckman; Speckman Law Group PLLC

(57) ABSTRACT

Ceramic inserts and hermetically sealed or sealable connectors incorporating a ceramic insert providing conductive pathways between opposing faces and/or side-walls and fabricated using multi-layer ceramic fabrication techniques are described. Conductive pads provided as metalized surfaces on the ceramic insert facilitate conductive communication between the conductive pathways transiting the ceramic inserts and conductive structures contacting the conductive pads, such as sockets, pins, wires, and the like.

23 Claims, 4 Drawing Sheets

CONNECTOR ASSEMBLIES INCORPORATING CERAMIC INSERTS HAVING CONDUCTIVE PATHWAYS AND INTERFACES

REFERENCE TO PRIORITY APPLICATION

This application claims priority to U.S. provisional patent application No. 61/097,105 filed Sep. 15, 2008. The disclosure of this priority application is incorporated by reference herein in its entirety.

FIELD OF INVENTION

The present invention relates generally to the field of connectors having feed through connections disposed through an insulating insert mounted in a connector body. The present invention relates, more specifically, to providing hermetic feed through connections in a multi-layer ceramic insert and, in some embodiments, providing a connector having a multi-layer ceramic insert hermetically bonded to the connector body.

BACKGROUND OF THE INVENTION

Hermetically sealed or sealable connectors are well known in the art. Exemplary hermetic connectors are described, for example, in U.S. Pat. Nos. 5,110,307, 6,932,644, 7,144,274 and 7,300,310. These patents relate, generally, to connectors having an outer connector shell or body with an interior insert having apertures sized to receive connector pin/socket structures. The connector pins are held in place and hermetically sealed within the apertures using a glass or ceramic material.

FIG. 1 illustrates a schematic cross-sectional view of a conventional (prior art), multi-pin RF feed-through connector of the type described above. Connector 100 comprises an outer support shell 110 having mounting bores 111 for attaching to a support structure of a companion external connector having an arrangement of pins that mate with and are inserted into sockets 112 for connection with associated conductive pins 115. In this type of connector, an insert 120 made, for example, from a metallic material such as stainless steel, is bonded to the outer support shell, such as at solder joint 113. Pins 115 and corresponding sockets 112 are generally mounted through cylindrical bores 114 provided in insert 120 and hermetically sealed in insert 120 using a dielectric material such as glass 118 or ceramic materials.

Because the different metallic materials comprising the connector shell and insert, and glass materials, have different thermal properties, e.g. different thermal expansion properties, the performance of connectors constructed in this fashion tends to degrade over periods of thermal cycling. Additional layers and components, or multi-layer structures, may be used to facilitate bonding of materials having similar thermal properties to one another to improve the durability and performance of the connector. The U.S. patents cited above describe connectors of this type.

Electronics packages have been produced using multilayer ceramics processes in which ceramic powders are prepared and cast as a tape. Metal powders are prepared as pastes and applied, generally by screen printing, on the green (or on a fired) ceramic tape. Individual components may be arranged in arrays on a multi-layer assembly for processing as a single unit and separated during or following processing. Via holes, edge castellations and cavities may be punched in the tape and then coated, or filled, with a refractory metal paste. These cavities provide electrical interconnections between layers and provide conductive pathways from one side to the other. The layers are stacked and laminated, and individual components may be cut or punched out, or the array may be scored to facilitate post-firing operations. The stacked, laminated structure is then sintered, or co-fired, at generally high temperatures in a controlled atmosphere environment. Ceramic packages may be plated or metalized to provide conductive areas for attachment of metal components by brazing. Metal pins, seal rings and heat sinks may be attached to metalized portions of ceramics packages by brazing to form hermetic joints. Alumina is a commonly used ceramic material for multi-layer packages because of its high strength, good thermal conductivity, hermeticity and desirable electrical properties.

SUMMARY

Connectors of the present invention comprise a ceramic insert having insulating properties and formed using multi-layer ceramic fabrication techniques. The ceramic inserts of the present invention incorporate one or more, and generally a plurality of, conductive traces or pathways provided penetrating the ceramic insert from one face to another, providing a signal pathway from one face of the ceramic insert to another. Conductive pads or other types of conductive members may be provided on exposed surface(s) of the ceramic insert providing an electrical interface for connecting to the traces or conductive pathways. The conductive pads or other types of conductive members provide conductive interfaces for attachment of conductive elements, such as sockets, pins, wires, or the like, providing an electrical pathway between the conductive pads or members provided on the interface surface to the traces or conductive pathways penetrating the ceramic insert, and to conductive pads or other types of conductive members exposed on different faces of the ceramic insert.

Conductivity and signal transmission is thus provided from one face to another of a ceramic insert using traces or conductive pathways within the ceramic insert. Ceramic inserts having conductive pathways transiting from one surface to another may be fabricated using a multi-layer ceramic fabrication process, which is a generally well-established and reliable fabrication technique. Ceramic inserts constructed in this manner provide insulative substrates having hermetically sealed electrical pathways transiting the ceramic insert that are accessible from the surfaces of the insert as desired. This construction and arrangement also allows many different configurations and densities of conductive pathways and external pads to be provided in connection with inserts and the resulting connector assemblies by making only minor modifications of the fabrication process. This system also facilitates ready and convenient modification of the patterns and placement of conductive pathways and external conductive pads simply by modifying the multi-layer ceramic fabrication process. Conductive pathways may take many different routes and configurations, as is known in the art, and may be terminated with conductive pads having different shapes, sizes and locations, and the like.

The conductive pads may be provided in the form of metallized terminations, and are generally sintered onto the ceramic insert to establish a reliable electrical connection to the underlying trace or conductive pathway using sintering techniques that are well known in the art. An additional metallization band may be provided along a perimeter of the ceramic insert on side walls joining the end faces to facilitate hermetic sealing of the ceramic insert in a metallic connector shell or casing. This provides a reliable and easily fabricated hermetic connector without requiring multiple or composite components and joints to provide the similar thermal properties required for hermetic sealing of the ceramic insert to a metallic connector body. Ceramic inserts and connectors having ceramic inserts as described herein are particularly suitable for use with keyed-type connectors, such as micro- nano- and sub-d connectors.

BRIEF DESCRIPTION OF THE DRAWINGS

The present invention will be described in greater detail in the following detailed description, with reference to the accompanying drawings, wherein.

DETAILED DESCRIPTION

Figure 1:
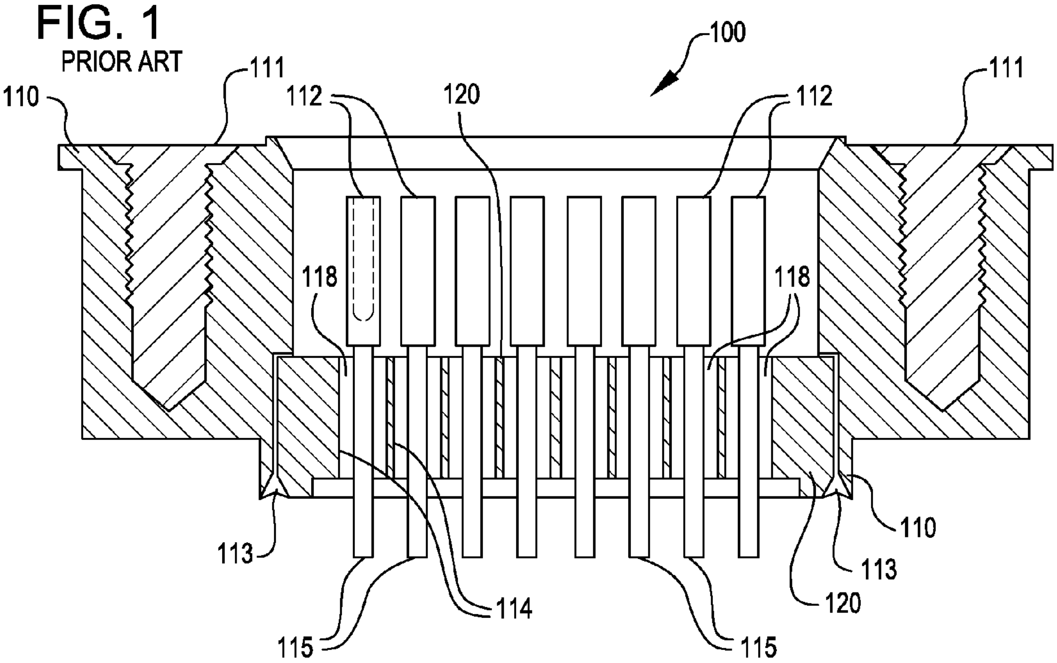
FIG. 1 PRIOR ART
FIG. 1 shows a cross-sectional view of an exemplary prior art multi-pin connector device.
Figure 2:
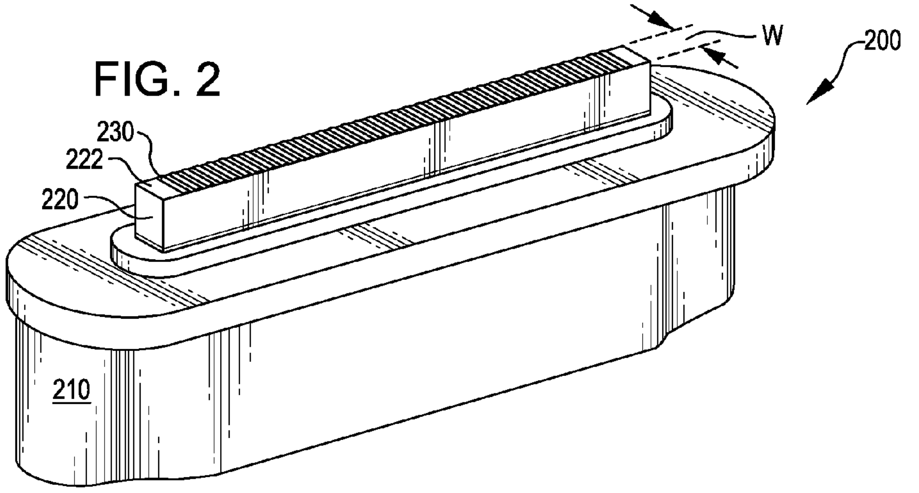
FIG. 2 shows a schematic perspective view of a ceramic insert mounted in a connector of the present invention.
Figure 3:
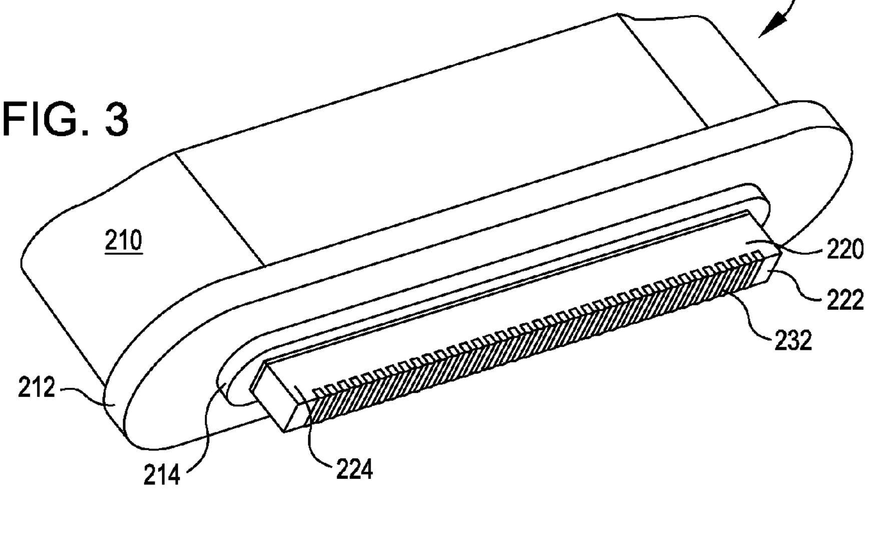
FIG. 3 shows a schematic perspective view of another embodiment of a ceramic insert mounted in a connector of the present invention.

FIGS. 2 and 3 illustrate a connector 200 of the present invention comprising an outer shell or casing 210 sized and configured to receive a ceramic insert 220 having a plurality of conductive metallization pads 230 provided on end-face 222. Connector shell 210 is generally mounted in and bonded (e.g., hermetically sealed) to a structure or installation and is preferably constructed from a metallic material having thermal properties compatible with the structure to which it's ultimately mounted and bonded. Metallic materials, such as Kovar®, stainless steel, titanium, titanium-containing alloys, aluminum, aluminum-containing alloys, high strength and low thermal expansion alloys, and the like are suitable materials for construction of connector shell 210. Connector shell 210 may comprise mounting bores (not shown in FIGS. 2 and 3) or other structures to facilitate mounting to a support structure, an enlarged mounting flange 212, and a stepped receiving area 214 for mounting ceramic insert 220. Connector casing 210 may also comprise or be associated with a bi-metallic or multi-metallic transition bushing that facilitates reliable and hermetic connection to materials having different thermal properties.

Ceramic insert 220 comprises an insulating ceramic material having a plurality of conductive traces transiting the insulative ceramic material and terminating in conductive pads 230 located on an exterior surface of the ceramic insert. Various types of ceramic insulators are known in the art and are suitable for use in constructing connectors of the present invention. Alumina (92% $Al_2O_3$-HTCC) is a preferred ceramic insulator for many applications because its performance is well established and it provides generally high strength, good thermal conductivity, hermeticity, good electrical properties and can be constructed at a relatively low cost. Alumina ceramic inserts may also be constructed having a generally high density arrangement of contacts. Other types of ceramic materials may be suitable for certain applications, including aluminum nitride, higher content alumina ceramics, low temperature co-fired ceramic materials, zirconia-alumina materials and beryllium oxide.

Multi-layer casting techniques are suitable for fabricating the ceramic inserts of the present invention. In general, low- and high-temperature co-fired ceramic (LTCC and HTCC, respectively) may be used in fabricating ceramic inserts of the present invention. Ceramic powder, organic binders and solvents are mixed and spread to a desired thickness, then cut into sheets (green tape). Trace holes or conductor pathways may then be punched into the tape, followed by metallization of the trace holes or conductor pathways. Metallization is generally accomplished by screen-printing metallic pastes on the surfaces and/or in the bores of the holes or pathways. Suitable metallization materials are well known. Conductor patterns and pathways may also be provided using alternative methodologies.

Multiple layers are then stacked and laminated, with the traces and conductor pathways aligned. Firing removes the solvents and organic binder(s), and the laminated structure is then sintered. Following sintering of the green ceramic structure, conductive pads, bands and the like are bonded to the sintered ceramic structure and electrically connected to the traces and conductor pathways, generally by a metallization sintering process. Selective areas of the ceramic insert, including all or a portion of the metalized surfaces, may then be plated with an electrolytic metal, such as electrolytic nickel or another material that facilitates brazing to the metalized structures.

Terminated conductive pads 230, or other types of conductive members, may be provided on an end-face 222 of connector insert 220, as shown in FIG. 2. Pads 230 are conductive, metallic members and provide both an external electrical contact for internal conductive pathways and a substrate for attaching (e.g., by brazing, soldering, application of conductive adhesives, epoxies and other conductive bonding agents) other conductive elements, such as sockets, pins, wires, and the like. Termination pads 230 substantially span the width (W) of ceramic insert end-face 222 in the embodiment shown in FIG. 2. A relatively dense arrangement of termination pads 230 is illustrated in FIG. 2, with termination pads 230 arranged in a regularly spaced linear arrangement and having a generally constant configuration and size. It will be appreciated that termination pads may be provided in different sizes and configurations and need not be regularly spaced.

FIG. 3 illustrates another embodiment of connector 200 in which terminated conductive pads 232 substantially span the width of end-face 222 and, additionally, contact at least a portion of a side-face 224 of connector insert 220 adjacent to end-face 222. This configuration is advantageous because it provides options for connection on either or both sides of the connector insert. The conductive pad portion contacting side-face 224 may have a substantially similar width to the connection pad portion contacting end-face 222 and may be from about 10% to about 100% the lengthwise dimension of the contact pad portion contacting end-face 222. It will be appreciated that many additional configurations of termination pads 232 may be provided. In some embodiments, termination pads may contact the end-face and both opposite side-faces, for example. The conductive pads may be provided in different sizes and configurations and need not be regularly spaced.

Figure 4A:
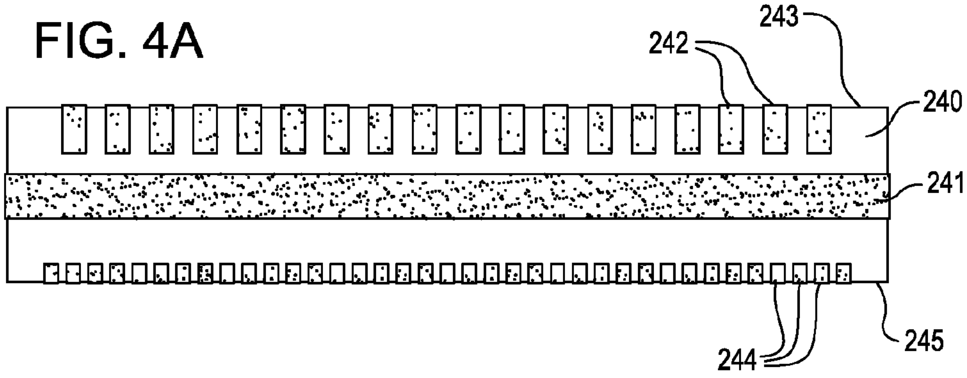
FIG. 4A shows a schematic side view of one embodiment of a ceramic insert of the present invention with conductive pads having different sizes and arrangements on opposite ends.
Figure 4B:
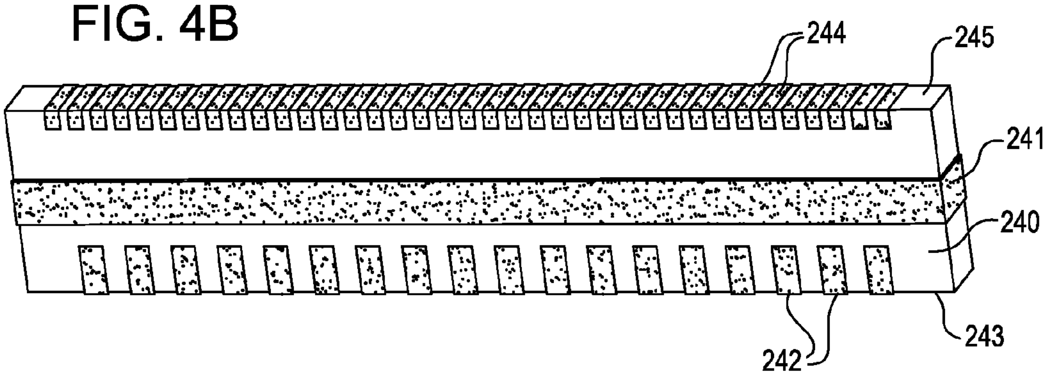
FIG. 4B shows a schematic perspective view of the ceramic insert of FIG. 4A.

FIGS. 4A-4D show illustrative configurations of conductive pads on feed through inserts of the present invention. FIGS. 4A and 4B illustrate different views of a ceramic feedthrough insert 240 having a metallization layer 241 provided along side walls in a generally central portion of its perimeter, a plurality of termination pads 242 provided on one side-face where it abuts end-face 243 and a plurality of termination pads 244 provided on another portion of the side-face where it abuts opposite end-face 245. Termination pads 242 and 244 are arranged in a regularly spaced pattern and have different sizes. Termination pads 242 are larger and fewer, while termination pads 244 are narrower, greater in number and spaced more closely together. Termination pads 242 span the width of end-face 243 and contiguous portions are provided on an abutting portion of an adjacent side-face, as shown. Termination pads 244 may similarly span the width of end-face 245, with contiguous portions provided on an abutting portion of the adjacent side-face. Alternatively, termination pads may be provided solely on the end-faces, or solely on a common side face, or on both an end face and one or both side faces. In alternative embodiments, the conductive pads may be provided in different sizes and configurations and need not be regularly spaced. It will be appreciated that the arrangement, spacing, etc. of the conductive pads depends, at least in part, on the arrangement of the underlying conductive traces and pathways.

Figure 4C:
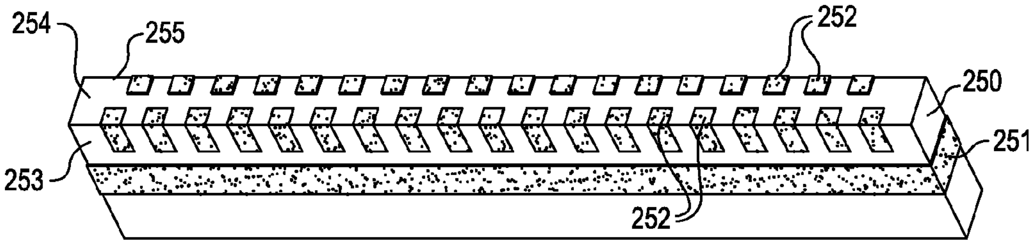
FIG. 4C shows a schematic perspective view of another embodiment of a ceramic insert of the present invention having a different arrangement of conductive pads.

FIG. 4C illustrates another embodiment of a feedthrough insert 250 of the present invention having a metallization layer 251 provided in a generally central portion of its perimeter, and a plurality of termination pads 252 provided on side-faces 253 and 255 and end-face 254. In this arrangement, termination pads 252 span a portion of end-face 254 and an abutting portion of side-face 253 or 255 and are arranged in an alternating pattern such that consecutive termination pads along the length of end-face 254 are arranged opposite one another. In the embodiment shown in FIG. 4C, termination pads 252 have a generally rectangular configuration and the portion of termination pads 252 contacting the side-faces 253 and 255 has a longer dimension than the portion of termination pads 252 contacting end-face 254. Additional termination pads (not shown) may be provided on another side face of the insert. It will be appreciated termination pads having many different configurations may be used in connection with inserts and connectors of the present invention. In alternative embodiments, the conductive pads may be provided in different sizes and configurations and need not be regularly spaced. It will be appreciated that the arrangement, spacing, etc. of the conductive pads depends, at least in part, on the arrangement of the underlying conductive traces and pathways.

Figure 4D:
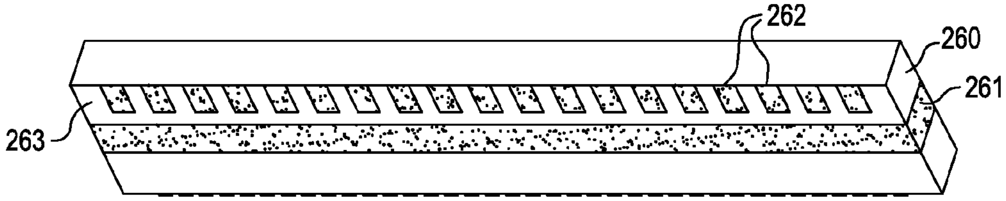
FIG. 4D illustrates a schematic perspective view of another embodiment of a ceramic insert of the present invention having yet an alternative arrangement of conductive pads.

FIG. 4D illustrates yet another embodiment of a feedthrough insert 260 of the present invention having a metallization layer 261 provided in a generally central portion of its perimeter, and a plurality of termination pads 262 provided on side-face 263. Additional termination pads (not shown) may additionally be provided on another side face of the insert. In the embodiment shown in FIG. 4D, termination pads 262 have a generally rectangular configuration and are regularly spaced. In alternative embodiments, the conductive pads may be provided in different sizes and configurations and need not be regularly spaced. It will be appreciated that the arrangement, spacing, etc. of the conductive pads depends, at least in part, on the arrangement of the underlying conductive traces and pathways.

Figure 5:
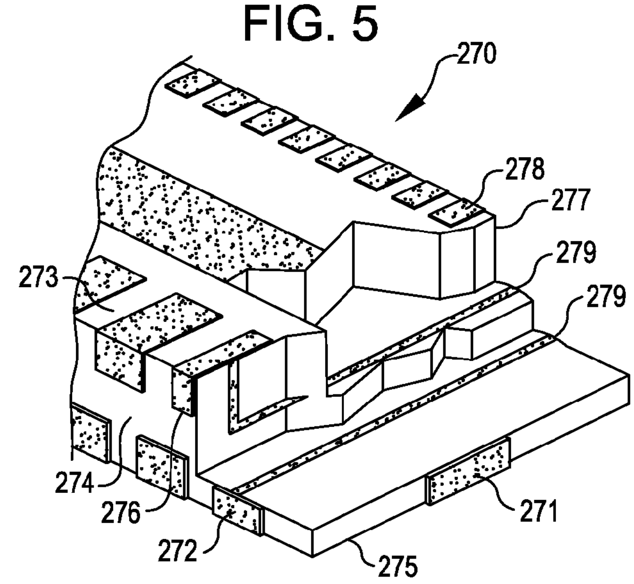
FIG. 5 shows a schematic perspective, broken away view of an embodiment of a ceramic insert of the present invention having conductive pathways connecting conductive pads located on different faces of the ceramic insert.

FIG. 5 illustrates, schematically, one embodiment of a ceramic insert 270 of the present invention having conductive traces providing conductive pathways between conductive pads provided on different surfaces of the insert. Feedthrough insert 270 has a metallization layer 271 provided in a generally central portion of its perimeter, a plurality of termination pads 272 provided on end-face 274 and side-face 275, a plurality of termination pads 276 provided on end-face 274 and side-face 273 opposite side face 275, and a plurality of termination pads 278 provided on end-face 277 and at least one side-face 273. In this arrangement, termination pads 272, 276 and 278 span a portion of end-faces 274 and 277, respectively, and an abutting portion of at least one of side-faces 273 or 275. In this embodiment, termination pads 272, 276 have a generally larger and wider configuration than termination pads 278 and are arranged in an offset arrangement with respect to one another. Conductive traces 279 provide electrical communication between conductive pads 272, 276 and conductive pads 278 on opposite ends of the ceramic insert. In the embodiment illustrated in FIG. 5, adjacent conductive pads 278 having a narrower and denser configuration are in electrical communication with alternate conductive pads 272, 276 by means of conductive traces 279. Conductive traces 279 are illustrated as following generally linear paths and providing a conductive pathway between conductive pads provided generally opposite one another. In alternative embodiments, conductive traces may have various configurations and may provide regular or irregular electrical pathways through the ceramic insert, and may provide electrical communication between conductive pads at disparate locations on the ceramic insert.

It will be appreciated termination pads having many different configurations, sizes and arrangements may be used in connection with inserts and connectors of the present invention. In alternative embodiments, for example, the conductive pads may be provided in different sizes and configurations and need not be regularly spaced. It will be appreciated that the arrangement, spacing, etc. of the conductive pads depends, at least in part, on the arrangement of the underlying conductive traces and pathways. It will also be appreciated that many different conductive pathways may be provided from one surface to another of ceramic inserts and connectors of the present invention.

Figure 6A:
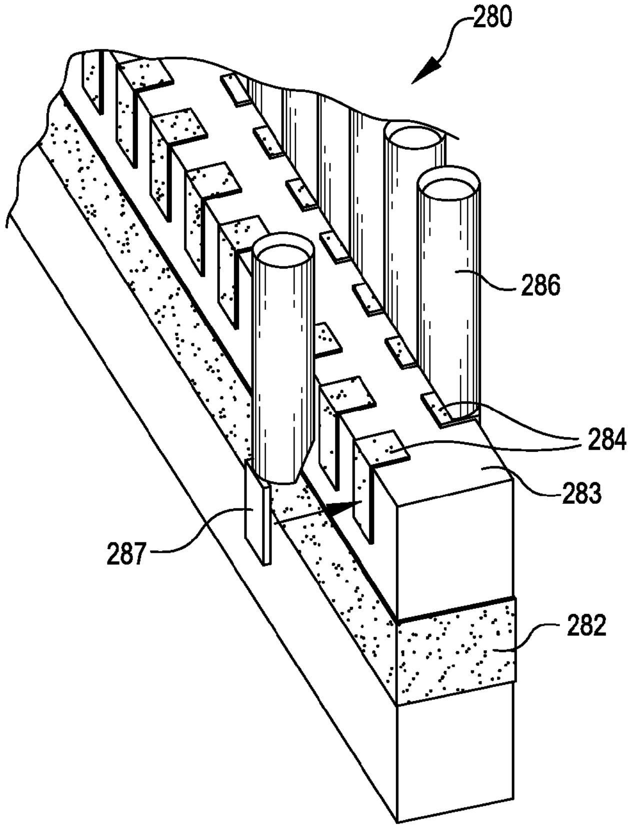
FIG. 6A shows an enlarged schematic perspective view of a ceramic insert of the present invention with sockets attached on one side and a socket separate from the insert on one side.
Figure 6B:
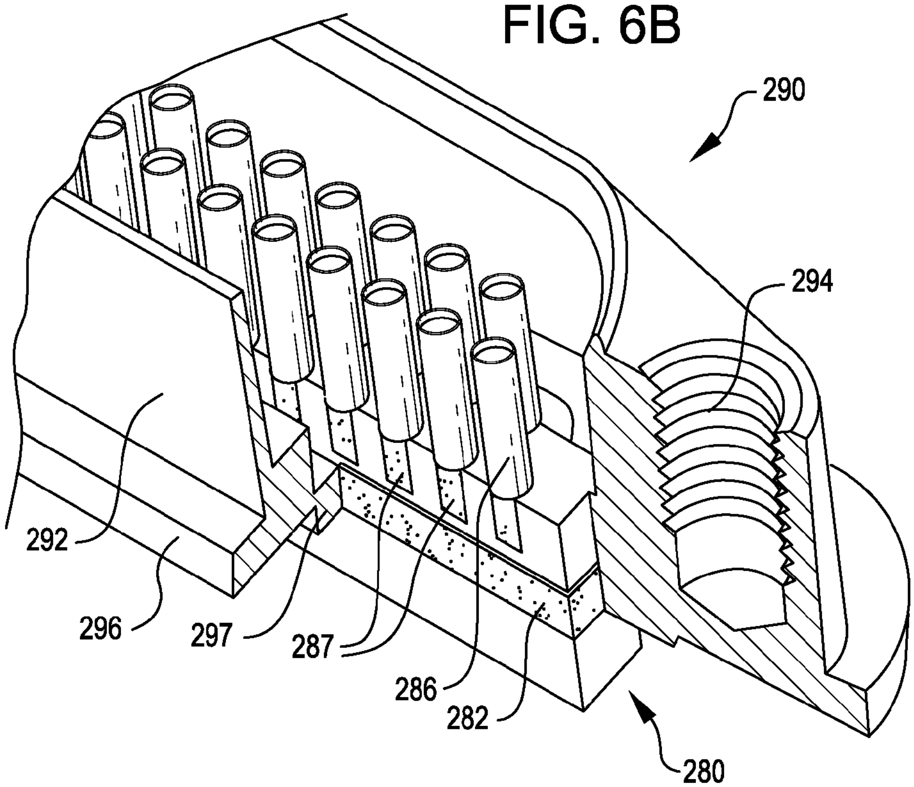
FIG. 6B shows an enlarged perspective, partially cut-away view of the connector of FIG. 6C.
Figure 6C:
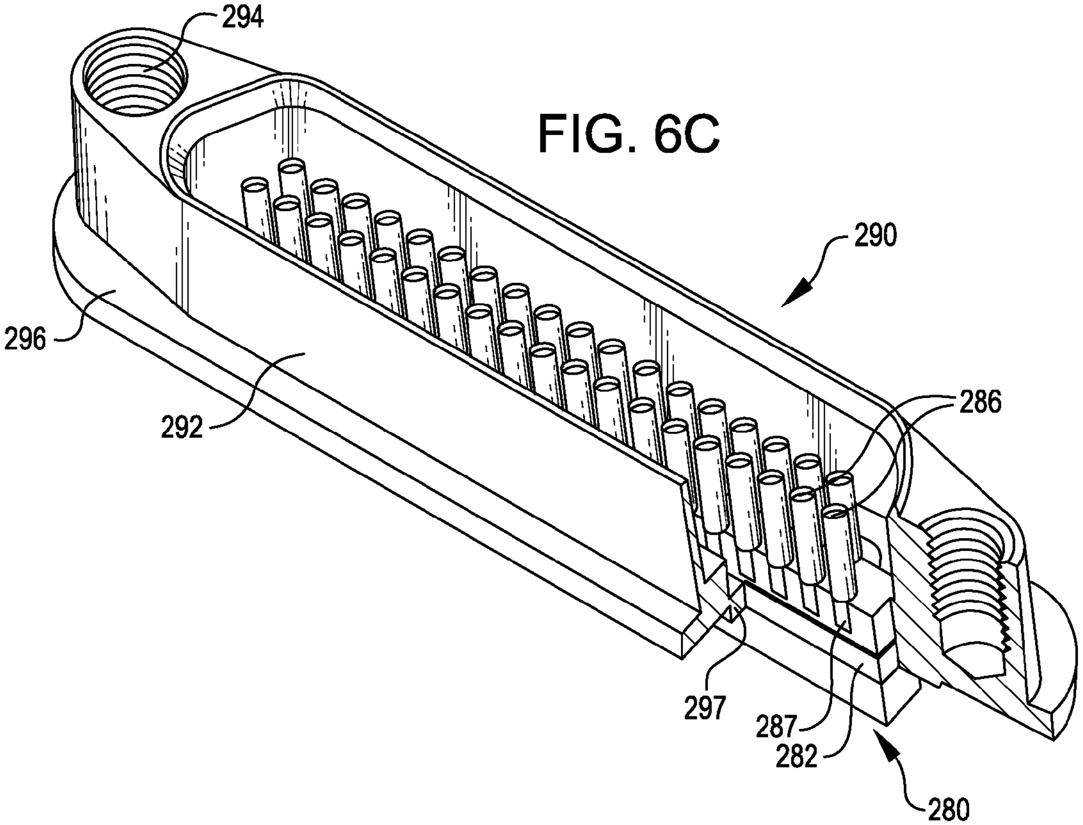
FIG. 6C shows a perspective, partially cut-away view of a ceramic insert with sockets bonded to one face of the insert mounted in a connector of the present invention.

FIG. 6A illustrates a partial perspective view of a ceramic insert of the present invention having sockets mounted on conductive pads, and FIGS. 6B and 6C illustrate a connector of the present invention, shown in a partially broken away view, incorporating a multi-layer ceramic insert having sockets bonded to the termination pads in a partially broken-away view.

Ceramic insert 280, as illustrated in FIG. 6A, incorporates a metalized band 282 along its perimeter for bonding the ceramic insert to a connector body or shell. Ceramic insert 280 also incorporates a plurality of conductive pads 284 contacting a portion of end-face 283, as well as a portion of an adjoining side-wall, and in electrical contact with underlying conductive traces. Sockets 286 are bonded to conductive pads 284. Sockets 286 provide a conductive receptacle and provide a conductive pathway when mating pins, wires, or the like are installed in the conductive receptacles. In the embodiment illustrated in FIG. 6A, sockets 286 comprise a receptacle portion having a generally cylindrical structure and terminating in a conductive receptacle at the base of the cylinder in the region that contacts the conductive pad, and also comprise a mounting portion 287, shown projecting below the socket, for attachment to a portion of conductive pad 284.

In the embodiment shown in FIG. 6A, mounting portion 287 of socket 286 is bonded to a portion of a conductive pad 284 using an appropriate bonding technique, such as brazing, welding, adhesives, epoxies, and the like, to establish a conductive pathway between the conductive pad 284 (and the underlying conductive trace) and the conductive receptacle provided in socket 286. When conductive pads are formed on both an end-face and an adjoining side-wall of a ceramic insert, as illustrated in FIGS. 6A-6C, the socket mounting portion 287 may be bonded to the portion of the conductive pad provided on the side-wall, while the socket and conductive receptacle may contact the portion of the same conductive pad provided on the ceramic insert end-wall. This arrangement provides convenient and effective mounting of sockets on ceramic inserts of the present invention to provide a conductive path from the conductive traces to conductive receptacles in sockets and, from there, to pins or similar structures that contact the conductive receptacles.

In the connector embodiments illustrated in FIGS. 6B and 6C, connector 290 is a micro-D connector comprising a metallic shell 292 having threaded bores 294 and an enlarged flange 296 to facilitate mounting. Ceramic insert 280 has a metalized band 282 along its perimeter that is hermetically bonded to a mating sealing flange 297 on the interior side of connector shell 292 to hermetically bond the ceramic insert to the connector shell. Ceramic insert 280 incorporates a plurality of termination pads 284 to which sockets 286 are bonded. Connector 290 thus provides a hermetically sealed connector providing a conductive pathway between sockets 286 and termination pads 284 to conductive pads or terminations or structures bonded to the conductive pads provided on the opposite end-face of insert 260 (not shown).

While certain embodiments of the present invention have been described, it will be understood that various changes could be made in the above constructions without departing from the scope of the invention. It is intended that all matter contained in the above description or shown in the accompanying drawings shall be interpreted as illustrative and not in a limiting sense.

I claim:

1. A connector assembly comprising: a connector shell; a ceramic insert constructed from an insulative ceramic material using a multi-layer ceramic fabrication process mounted in the connector shell and incorporating at least one conductive pathway transiting through an internal portion of the insulative ceramic material from one face to another; and at least two conductive pads provided on exposed surfaces of the ceramic insert, each conductive pad being electrically connected to at least one terminus of at least one conductive pathway, wherein the conductive pathway(s) follow generally linear path(s) transiting the ceramic insert and provide conductive pathway(s) between conductive pads located generally opposite one another.

2. A connector assembly comprising: a connector shell; a ceramic insert constructed from an insulative ceramic material mounted in the connector shell and incorporating at least one conductive pathway transiting through an internal portion of the insulative ceramic material from one face to another; and at least two conductive pads provided on exposed surfaces of the ceramic insert, each conductive pad being electrically connected to at least one terminus of at least one conductive pathway, wherein—the connector shell is constructed from a metallic material selected from the group consisting of: [Kovar®] iron-nickel alloy, stainless steel, titanium, titanium-containing alloys, aluminum, aluminum-containing alloys, high strength and low thermal expansion alloys.

3. A connector assembly comprising: a connector shell: a ceramic insert constructed from an insulative ceramic material using a multi-layer ceramic fabrication process mounted in the connector shell and incorporating at least one conductive pathway transiting through an internal portion of the insulative ceramic material from one face to another: and at least two conductive pads provided on exposed surfaces of the ceramic insert, each conductive pad being electrically connected to at least one terminus of at least one conductive pathway, wherein at least one of the conductive pathway(s) follows a generally non-linear path and provides a conductive pathway between conductive pads located at disparate, generally non-opposite locations on the ceramic insert.

4. A ceramic insert for mounting in a connector shell, wherein the ceramic insert comprises a plurality of conductive traces transiting through an internal portion of the insert from one face or side-wall to another and terminating, at each thee or side wall, at a conductive pad provided as a metalized surface on the ceramic insert, wherein the ceramic insert is constructed from an insulative ceramic material using a multi-laver ceramic fabrication process, and wherein the conductive traces follow generally linear path(s) transiting the ceramic insert and provide conductive pathways between conductive pads located generally opposite one another.

5. A ceramic insert for mounting in a connector shell, wherein the ceramic insert comprises at least one conductive pathway transiting the insert from one face or side-wall to another and terminating, at each face or side wall, at a conductive pad provided as a metalized surface on the ceramic insert, wherein the ceramic insert is constructed from an insulative ceramic material using a multi-layer ceramic fabrication process, and wherein at least one of the conductive pathways follows a generally non-linear path and provides a conductive pathway between conductive pads located at disparate, generally non-opposite locations on the ceramic insert.

6. The connector assembly of either of claims 1 or 3, additionally comprising a conductive element mounted to and projecting from each conductive pad, providing an electrical pathway from the conductive element, through the conductive pad and the conductive pathway.

7. The connector assembly of claim 6, comprising a plurality of conductive elements mounted to and projecting from a plurality of conductive pads provided on at least two exposed surfaces of the ceramic insert, providing a plurality of conductive pathways transiting the insulative ceramic material.

8. The connector assembly of claim 6, wherein the conductive elements mounted to and projecting from each conductive pad are sockets having a conductive receptacle bonded to the conductive pad.

9. The connector assembly of claim 8, wherein the sockets comprise a conductive receptacle portion extending from the ceramic insert and a mounting portion bonded to the conductive pad.

10. A connector assembly of either of claims 1 or 3, additionally comprising: a conductive element mounted to and projecting from each conductive pad, wherein the connector assembly has a micro-, nano- or sub-d configuration.

11. The connector assembly of claim 2, wherein the connector shell additionally comprises a multi-metallic transition bushing.

12. The connector assembly of either of claim 1 or 3, wherein the ceramic insert is constructed from an insulative ceramic material using a high temperature co-fired ceramic fabrication process.

13. The connector assembly of either of claims 1 or 3, wherein the ceramic insert is constructed from an insulative material selected from the group consisting of: Alumina; aluminum nitride; alumina-containing ceramic materials; low temperature co-fired ceramic materials; zirconia-alumina materials; and beryllium oxide.

14. The connector assembly of claim 6, wherein the conductive elements comprise sockets, pins, and/or wires.

15. The connector assembly of claim 14, wherein the conductive elements are connected to terminated conductive pads by brazing, soldering, conductive adhesives, epoxies or other conductive bonding agents.

16. The connector assembly of claim 7, wherein the conductive pads are arranged in a regularly spaced linear arrangement and have a generally constant configuration and size.

17. The connector assembly of claim 7, wherein the conductive pads substantially span the width of each end face of the ceramic insert.

18. The connector assembly of claim 7, wherein the conductive pads contact on each end face and contact at least a portion of a side face of the connector insert adjacent to the end face.

19. The connector assembly of claim 7, wherein conductive pads are provided on each end face of the ceramic insert and have a different size and/or configuration.

20. The ceramic insert of either of claims 4 or 5, wherein the ceramic insert is constructed from an insulative ceramic material using a high temperature co-fired ceramic fabrication process.

21. A method for constructing connectors, comprising: providing a ceramic insert of either of claims 4 or 5; mounting the ceramic insert in a connector shell; and mounting conductive members having conductive portions extending from the ceramic insert to metalized conductive pads of the ceramic insert.

22. A method for constructing connectors, comprising: providing a ceramic insert of either of claims 4 or 5, the ceramic insert additionally comprising a metallization band extending along a perimeter of the ceramic insert on side walls to facilitate sealing of the ceramic insert in the connector shell; mounting the ceramic insert in a connector shell; mounting conductive members having conductive portions extending from the ceramic insert to metalized conductive pads of the ceramic insert; and bonding the metallization band to a portion of the connector shell.

23. The method of claim 21, additionally comprising bonding a mounting portion of a socket to a portion of a conductive pad to establish a conductive pathway between the conductive pad and the underlying conductive pathway and a conductive receptacle provided in the socket.

* * * * *